(12) United States Patent
Weiser et al.

(10) Patent No.: US 8,852,829 B2
(45) Date of Patent: *Oct. 7, 2014

(54) PREPOLYMER-BASED POLYURETHANE FORMULATIONS FOR PRODUCING HOLOGRAPHIC MEDIA

(75) Inventors: Marc-Stephan Weiser, Leverkusen (DE); Thomas Rölle, Leverkusen (DE); Friedrich-Karl Bruder, Krefeld (DE); Thomas Fäcke, Leverkusen (DE); Dennis Hönel, Zülpich-Wichterich (DE); Sebastian Dörr, Düsseldorf (DE); Nicolas Stöckel, Köln (DE)

(73) Assignee: Bayer MaterialScience AG, Leverkusen (DE)

( * ) Notice: Subject to any disclaimer, the term of this patent is extended or adjusted under 35 U.S.C. 154(b) by 110 days.

This patent is subject to a terminal disclaimer.

(21) Appl. No.: 13/122,005

(22) PCT Filed: Sep. 24, 2009

(86) PCT No.: PCT/EP2009/006890
§ 371 (c)(1), (2), (4) Date: Apr. 19, 2011

(87) PCT Pub. No.: WO2010/037496
PCT Pub. Date: Apr. 8, 2010

(65) Prior Publication Data
US 2011/0189591 A1 Aug. 4, 2011

(30) Foreign Application Priority Data
Oct. 1, 2008 (EP) .................... 08017273

(51) Int. Cl.
*G03H 1/02* (2006.01)
*G11B 7/245* (2006.01)
*C08G 18/08* (2006.01)
*C08G 18/10* (2006.01)
*C08G 18/48* (2006.01)
*C08G 18/67* (2006.01)
*C08G 18/77* (2006.01)
*C08G 18/78* (2006.01)
*G03F 7/00* (2006.01)
*G03F 7/027* (2006.01)
*G03F 7/035* (2006.01)
*G11B 7/24044* (2013.01)
*G03H 1/26* (2006.01)
*G11B 7/0065* (2006.01)
*G11B 7/26* (2006.01)

(52) U.S. Cl.
CPC ........ *G11B 7/245* (2013.01); *G03H 2001/0264* (2013.01); *G03H 2001/264* (2013.01); *G03H 2240/24* (2013.01); *G03H 2260/12* (2013.01); *G03H 2260/14* (2013.01); *C08G 18/089* (2013.01); *C08G 18/10* (2013.01); *C08G 18/4825* (2013.01); *C08G 18/4841* (2013.01); *C08G 18/485* (2013.01); *C08G 18/672* (2013.01); *C08G 18/776* (2013.01); *C08G 18/7837* (2013.01); *G03F 7/001* (2013.01); *G03F 7/027* (2013.01); *G03F 7/035* (2013.01); *G11B 7/0065* (2013.01); *G11B 7/24044* (2013.01); *G11B 7/26* (2013.01)
USPC ............. 430/1; 430/2; 430/281.1; 430/280.1; 359/3

(58) Field of Classification Search
None
See application file for complete search history.

(56) References Cited

U.S. PATENT DOCUMENTS

| 6,743,552 | B2 | 6/2004 | Setthachayanon et al. | |
|---|---|---|---|---|
| 6,765,061 | B2 | 7/2004 | Dhar et al. | |
| 6,780,546 | B2 | 8/2004 | Trentler et al. | |
| 8,361,678 | B2 * | 1/2013 | Weiser et al. ........... | 430/1 |
| 2003/0044690 | A1 * | 3/2003 | Rotto ..................... | 430/1 |
| 2005/0058911 | A1 * | 3/2005 | Takeyama ............... | 430/1 |
| 2005/0259303 | A1 * | 11/2005 | Setthachayanon et al. | 359/15 |
| 2006/0194120 | A1 | 8/2006 | Cole et al. | |
| 2006/0194122 | A1 * | 8/2006 | Takizawa ................ | 430/1 |
| 2008/0311482 | A1 * | 12/2008 | Stockel et al. ........... | 430/2 |
| 2008/0312403 | A1 * | 12/2008 | Stockel et al. ........... | 528/59 |

| | | | |
|---|---|---|---|
| 2010/0039685 A1* | 2/2010 | Miki et al. | 359/3 |
| 2010/0086861 A1* | 4/2010 | Weiser et al. | 430/2 |
| 2010/0087564 A1* | 4/2010 | Weiser et al. | 522/95 |
| 2010/0112459 A1* | 5/2010 | Weiser et al. | 430/2 |
| 2010/0203241 A1* | 8/2010 | Weiser et al. | 427/162 |
| 2011/0204616 A1* | 8/2011 | Geuens | 283/72 |
| 2011/0207029 A1* | 8/2011 | Hagen et al. | 430/2 |
| 2011/0311905 A1* | 12/2011 | Honel et al. | 430/2 |
| 2011/0311906 A1* | 12/2011 | Rolle et al. | 430/2 |
| 2012/0219884 A1* | 8/2012 | Weiser et al. | 430/2 |
| 2012/0231376 A1* | 9/2012 | Rolle et al. | 430/2 |

FOREIGN PATENT DOCUMENTS

| | | |
|---|---|---|
| EP | A 0223587 | 5/1987 |
| JP | 2007101743 | 4/2007 |
| WO | WO-03/023520 | 3/2003 |
| WO | WO-03/102959 | 12/2003 |

OTHER PUBLICATIONS

Hexamethylene diisocyanate data sheet (Sigma-Aldrich, no date) (2 pages).*
Methylenebis(cyclohexyl isocyanate) data sheet (Sigma—Aldrich, no date) (3 pages).*
Polytetrahydrofuran, MSDS, (Sigma-Aldrich, 2008) (5 pages).*
Gu, H., et al., *Photolysis of Iodonium Salts in the Presence of 1-Naphthol and 1-Methoxynaphthalene*, Center for Photochemical Sciences, Bowling Green State University, 41(2), 1266, Polymer Reprints (2000).
Cunningham, A., et al., *Acid-Stable Dye-Borate Electron Transfer Photoinitiators*, Additives Division, Ciba Specialty Chemicals.
Dektar, J., et al., *Photochemistry of Diaryliodonium Salts*, pp. 639-647, vol. 55, J. Org. Chem. (1990).
Dektar, J., et al., *Comparison of the Photochemistry of Diatylchloronium, Diarylbromonium, and Diaryliodonium Salts*, pp. 1838-1844, vol. 56, J. Org. Chem. (1991).
Yamaguchi, Y., et al., *Benzoyl-Substituted Ferrocenes: An Attractive New Class of Anionic Photoinitiators*, pp. 1152-1156, vol. 33, Macromolecules 2000, American Chemical Society (2000).
Kutal, C., et al., *A Novel Strategy for Photoinitiated Anionic Polymerization*, pp. 6872- 6873, vol. 24, Macromolecules 1991, American Chemical Society (1991).
Jarikov, V., et al., *Anionic Photopolymerization of Methyl 2-Cyanoacrylate and Simultaneous Color Formation*, pp. 7761-7764, vol. 33, Macromolecules 2000, American Chemical Society (2000).
Hua, Y., et al., *Development of Polymeric Photosensitizers for Photoinitiated Cationic Polymerization*, pp. 2488-2494, vol. 34, Macromolecules 2001, American Chemical Society (2001).
Crivello, J., et al., *Synthesis and Characterization of Second-Generation Dialkylphenacylsulfonium Salt Photoinitiators*, pp. 825, 832, vol. 33, Macromolecules 2000, American Chemical Society (2000).
Li, B., et al., *Infrared Laser-Induced Photopolymerization: Synthesis of Photoinitiator and Kinetics Monitoring of Polymerization*, pp. 139-149, vol. 84, Polymeric Materials: Science & Engineering (2001).
Logemann, H., *Zusaetze nach beendeter Polymerisation*, pp. 433-469.
Kogelnik, H., *Coupled Wave Theory for Thick Hologram Gratings*, pp. 2909-2947, vol. 48, No. 9.,The Bell System Technical Journal (Nov. 1999).

* cited by examiner

*Primary Examiner* — Martin Angebrannt
(74) *Attorney, Agent, or Firm* — Drinker Biddle & Reath LLP

(57) ABSTRACT

The present invention relates to a polyurethane composition comprising
- A) a polyisocyanate component comprising an exclusively diol-based NCO-terminated polyurethane prepolymer, wherein the NCO groups are bonded in a primary manner,
- B) an isocyanate-reactive polymer,
- C) a compound having groups which react by polymerizing with an ethylenically unsaturated compound under the action of actinic radiation (radiation-curing groups) wherein the compound is free of NCO groups,
- D) a free-radical stabilizer,
- E) a photoinitiator,
- F) optionally a catalyst,
- G) optionally assistants and additives.

11 Claims, 2 Drawing Sheets

PREPOLYMER-BASED POLYURETHANE FORMULATIONS FOR PRODUCING HOLOGRAPHIC MEDIA

CROSS REFERENCE TO RELATED APPLICATIONS

This application is a national stage application (under 35 U.S.C. §371) of PCT/EP2009/006890, filed Sep. 24, 2009, which claims benefit of European application 08017273.7 filed Oct. 1, 2008.

BACKGROUND OF THE INVENTION

The present invention relates to novel polyurethane compositions which are advantageously suitable for the production of holographic media for purposes including data storage, but also for optical applications of a wide variety of types.

Holographic media may be used inter alia for data storage, in the field of security technology (for example the three-dimensional representation of people or objects and the authentication of a person or of an article), the representation of objects, for advertising, as auxiliary materials for production of complex three-dimensional structures and as a visual display unit or as components of visual display unit parts, and for production of an optical element with the function of a lens, of a mirror, of a filter, of a diffusion disc, of a diffraction element, of a light conductor and/or of a mask.

Holographic media based on a polymer matrix and one or more free-radically polymerizable compounds embedded therein writing monomers are described, for example, in U.S. Pat. No. 6,743,552.

U.S. Pat. No. 6,743,552, U.S. Pat. No. 6,765,061 and U.S. Pat. No. 6,780,546 disclose two-component polyurethane formulations which, however, do not comprise any prepolymers having primary NCO groups.

U.S. Pat. No. 6,743,552, U.S. Pat. No. 6,765,061, U.S. Pat. No. 6,780,546 and U.S. 2006/0194120 disclose two-component polyurethane formulations. Some of the formulations described therein contain prepolymers as the isocyanate component, these being exclusively those prepolymers with secondary isocyanate groups, and therefore being unsatisfactory in terms of curing rate.

JP 2007101743 describes the use of prepolymers consisting of dicyclohexylmethane 4,4'-diisocyanates ("H12-MDI") and trifunctional polypropylene oxide glycerol ether with addition of 1,4-butanediol as a chain extender for the production of PU matrices for holographic media for optical data storage.

However, a disadvantage of the known systems based on polyurethane, especially for optical applications outside digital data storage, is that the achievable brightness of the holograms stored in such media is too low. The reason for this is usually that the relative difference in the refractive indices of polyurethane matrix and writing monomer is too small. An arbitrary variation in the matrix polymer, though, is impossible since a good compatibility of matrix polymer with writing monomer and the further components present in the formulations must always be ensured. Moreover, for processing reasons, the simplest possible mixing and provision of the formulations is of interest.

It was therefore an object of the present invention to provide novel polyurethane compositions which meet the abovementioned requirements.

BRIEF SUMMARY OF THE INVENTION

It has now been found that, surprisingly, the abovementioned requirements can be fulfilled when, instead of monomeric or oligomeric isocyanates, specific prepolymers with NCO groups bonded in a primary manner and based on difunctional polyols are used in the isocyanate component of the polyurethane compositions.

The invention therefore provides polyurethane compositions comprising

A) a polyisocyanate component at least containing an exclusively diol-based NCO-terminated polyurethane prepolymer, the NCO groups of which are bonded in a primary manner,
B) isocyanate-reactive polymers
C) compounds which have groups which react by polymerizing with ethylenically unsaturated compounds under the action of actinic radiation (radiation-curing groups) and are themselves free of NCO groups,
D) free-radical stabilizers
E) photoinitiators
F) optionally catalysts
G) optionally assistants and additives.

The inventive prepolymers of component A) are obtained in a manner well known to those skilled in the art by reaction of monomeric, oligomeric or polyisocyanates A1) with isocyanate-reactive compounds A2) in suitable stoichiometry with optional use of catalysts and solvents.

In this way, it is possible to prepare NCO-functional prepolymers with urethane, allophanate, biuret and/or amide groups.

Suitable polyisocyanates A1) are all aliphatic, cycloaliphatic, aromatic or araliphatic di- and triisocyanates known to those skilled in the art, and it is unimportant whether they have been obtained by means of phosgenation or by phosgene-free processes. In addition, it is also possible to use the higher molecular weight conversion products, well known per se to those skilled in the art, of monomeric di- and/or triisocyanates with urethane, urea, carbodiimide, acylurea, isocyanurate, allophanate, biuret, oxadiazinetrione, uretdione, iminooxadiazinedione structure, each individually or in any desired mixtures with one another.

Examples of suitable monomeric di- or triisocyanates which can be used as component A1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

The isocyanate-reactive compounds A2) used to form the prepolymers are preferably OH- and/or NH-functional compounds. Suitable oligomeric or polymeric difunctional isocyanate-reactive compounds for preparation of the prepolymers by the abovementioned processes are in principle all low molecular weight short-chain, i.e. containing 2 to 20 carbon atoms, aliphatic, araliphatic or cycloaliphatic diols and/or higher polyols. Examples of diols are ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positionally isomeric diethyloctanediols, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropyl 2,2-dimethyl-3-hydroxypropionate. Also suitable are difunctional, higher molecular weight aliphatic and cycloaliphatic polyols such as polyester polyols, polyether polyols, polycarbonate polyols, hydroxy-functional acrylic resins, hydroxy-functional polyurethanes, hydroxy-functional epoxy resins or corresponding hybrids (cf. Römpp Lexikon Chemie, p. 465-466, 10$^{th}$ ed. 1998, Georg-Thieme-Verlag, Stuttgart).

Useful polyester polyols include linear polyester diols, as can be prepared in a known manner from aliphatic, cycloaliphatic or aromatic di- or polycarboxylic acids or the anhydrides thereof, for example succinic acid, glutaric acid, adipic acid, pimelic acid, suberic acid, azelaic acid, sebacic acid, nonanedicarboxylic acid, decanedicarboxylic acid, terephthalic acid, isophthalic acid, o-phthalic acid, tetrahydrophthalic acid, hexahydrophthalic acid or trimellitic acid, and acid anhydrides such as o-phthalic anhydride, trimellitic anhydride or succinic anhydride, or a mixture thereof with polyhydric alcohols, for example ethanediol, di-, tri-, tetraethylene glycol, 1,2-propanediol, di-, tri-tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol or mixtures thereof. Useful alcohols for preparation of the polyester polyols of course also include cycloaliphatic and/or aromatic dihydroxy compounds. Instead of the free polycarboxylic acid, it is also possible to use the corresponding polycarboxylic anhydrides or corresponding polycarboxylic esters of lower alcohols or mixtures thereof to prepare the polyesters.

It will be appreciated that the polyester polyols may also be homo- or copolymers of lactones, which are preferably obtained by addition of lactones or lactone mixtures, such as butyrolactone, ε-caprolactone and/or methyl-ε-caprolactone, onto suitable difunctional and/or higher-functionality starter molecules, for example the low molecular weight polyhydric alcohols mentioned above as formation components for polyester polyols.

Useful polyhydroxyl components also include polycarbonates having hydroxyl groups, for example those which can be prepared by reaction of diols such as 1,4-butanediol and/or 1,6-hexanediol and/or 3-methylpentanediol with diaryl carbonates, e.g. diphenyl carbonate, dimethyl carbonate or phosgene.

As polyether polyols be, for example, the difunctional polyaddition products of the styrene oxides, of ethylene oxide, of propylene oxide, of tetrahydrofuran, of butylene oxide, or of epichlorohydrin, and the mixed addition and grafting products thereof, and also the polyether polyols obtained by condensation of dihydric alcohols or mixtures thereof and those obtained by alkoxylation of dihydric alcohols, difunctional amines and difunctional amino alcohols. Preferred difunctional polyether polyols are poly(propylene oxide)s, poly(ethylene oxides) and combinations thereof in the form of random or block copolymers or poly(tetrahydrofuran)s, and also mixtures thereof having a number-average molar mass between 200 and 18 000 g/mol, more preferably having a number-average molar mass between 600 and 8000 g/mol and most preferably having a number-average molar mass between 650 and 4500 g/mol.

It is likewise possible to use amines for prepolymer preparation. Suitable examples are ethylenediamine, diethylenetriamine, triethylenetetramine, propylenediamine, diaminocyclohexane, diaminobenzene, diaminobisphenyl, difunctional polyamines, for example the Jeffamine®, amine-terminated polymers having number-average molar masses up to 10 000 g/mol, or any desired mixtures thereof with one another.

To prepare biuret group-containing prepolymers, isocyanate in excess is reacted with amine to form a biuret group. Suitable amines in this case for the reaction with the di-, tri- and polyisocyanates mentioned are all oligomeric or polymeric, primary or secondary, difunctional amines of the type mentioned above.

For urethanization, isocyanate is reacted with alcohol in stoichiometric amounts to form a urethane group. Suitable alcohols in this case for the reaction with the di-, tri- and polyisocyanates mentioned are all oligomeric or polymeric, primary or secondary, difunctional alcohols of the type mentioned above. In the context of the urethane prepolymers, these are preferably ethanediol, di-, tri-, tetraethylene glycol, 1,2-propanediol, di-, tri-tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, polyethylene glycol, polypropylene glycol, block polymers and/or copolymers of ethylene oxide and propylene oxide, other 1-alkene oxides, poly(THF), polyester polyols and polyacrylate polyols having number-average molar masses up to 10 000 g/mol, or any desired mixtures thereof with one another.

For allophanatization, an isocyanate is first reacted with an alcohol in a stoichiometric ratio to give a urethane, which is then reacted with a further isocyanate to form an allophanate. Suitable alcohols in this case for the reaction with the di-, tri- or polyisocyanates mentioned to give the urethane are all oligomeric or polymeric, primary or secondary, difunctional alcohols of the type described above. For the further reaction to give the allophanate, preference is given to adding the monomeric di- or triisocyanates HDI, TMDI and TIN. Preferred isocyanate-reactive compounds for allophanate formation are ethylene glycol, diethylene glycol, triethylene glycol, tetraethylene glycol, dipropylene glycol, tripropylene glycol, 1,2-propanediol, 1,3-propanediol, 1,4-butanediol, 1,6-hexanediol and higher polyols of the aliphatic polyester polyol, polyether polyol, polycarbonate polyol type.

DETAILED DESCRIPTION OF THE INVENTION

Figure 1:
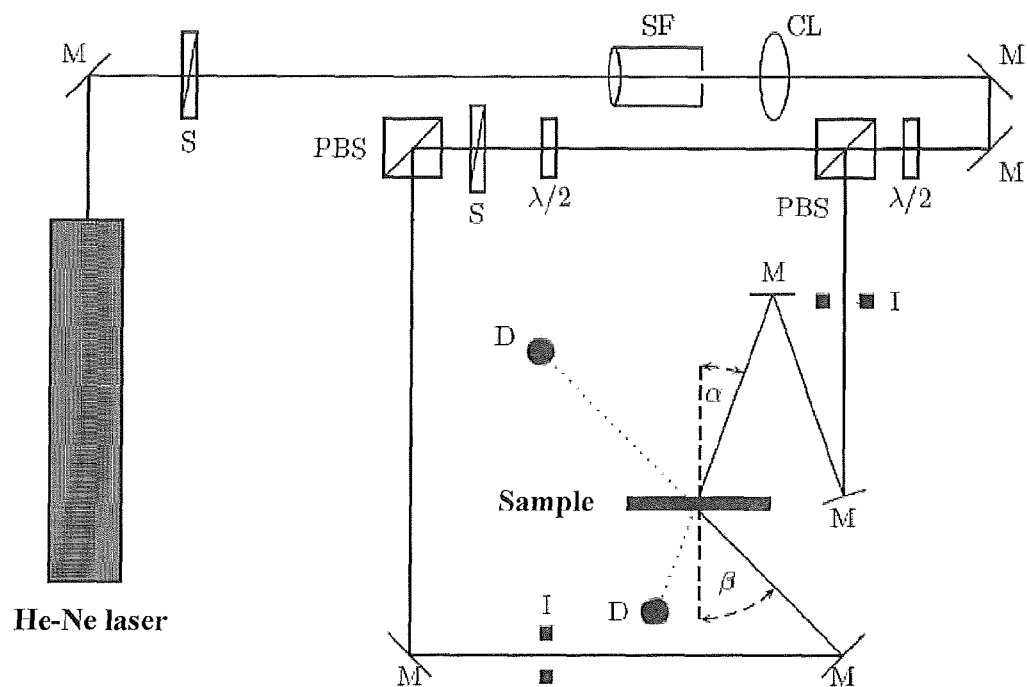
FIG. 1 illustrates an analysis setup to measure holographic properties of media.

Preferred prepolymers are urethanes, allophanates or biurets formed from aliphatic isocyanate-functional compounds and oligomeric or polymeric isocyanate-reactive compounds having number-average molar masses of 200 to 10 000 g/mol; particular preference is given to urethanes, allophanates or biurets formed from aliphatic isocyanate-functional compounds and oligomeric or polymeric polyols or polyamines having number-average molar masses of 500 to 8500 g/mol, and particular preference is given to allophanates formed from HDI or TMDI and difunctional polyether polyols having number-average molar masses of 1000 to 8200 g/mol.

Preferably, the above-described prepolymers have residual contents of free monomeric isocyanate of less than 1% by weight, more preferably less than 0.5% by weight, most preferably less than 0.2% by weight.

It will be appreciated that the isocyanate component may contain proportions of further isocyanate components in addition to the prepolymers described. Useful for this purpose are aromatic, araliphatic, aliphatic and cycloaliphatic di-, tri- or polyisocyanates used. It is also possible to use mixtures of such di-, tri- or polyisocyanates. Examples of suitable di-, tri- or polyisocyanates are butylene diisocyanate, hexamethylene diisocyanate (RDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyciohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, triphenylmethane 4,4',4"-triisocyanate or derivatives thereof having a urethane, urea, carbodiimide, acylurea, isocyanurate, allophanate, biuret, oxadiazinetrione, uretdione or iminooxadiazinedione structure and mixtures thereof. Preference is given to polyisocyanates based on oligomerized and/or derivatized diisocyanates which have been freed of excess diisocyanate by suitable processes, especially those of hexamethylene diisocyanate. Particular preference is given to the oligomeric isocyanurates, uretdiones and iminooxadiazinediones of HDI and mixtures thereof.

It is optionally also possible for the isocyanate component A) to contain proportions of isocyanates which have been partially reacted with isocyanate-reactive ethylenically unsaturated compounds. Preference is given here to using, as isocyanate-reactive ethylenically unsaturated compounds, α,β-unsaturated carboxylic acid derivatives such as acrylates, methaciylates, maleates, fumarates, maleimides, acrylamides, and vinyl ethers, propenyl ethers, allyl ethers and compounds which contain dicyclopentadienyl units and have at least one group reactive toward isocyanates; these are more preferably acrylates and methacrylates having at least one isocyanate-reactive group. Useful hydroxy-functional acrylates or methacrylates include, for example, compounds such as 2-hydroxyethyl (meth)acrylate, polyethylene oxide mono (meth)acrylates, polypropylene oxide mono(meth)acrylates, polyalkylene oxide mono(meth)acrylates, poly(ϵ-caprolactone) mono(meth)acrylates, for example Tone® M100 (Dow, USA), 2-hydroxypropyl (meth)acrylate, 4-hydroxybutyl (meth)acrylate, 3-hydroxy-2,2-dimethylpropyl (meth)acrylate, the hydroxy-functional mono-, di- or tetra(meth)acrylates of polyhydric alcohols such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. In addition, isocyanate-reactive oligomeric or polymeric unsaturated compounds containing acrylate and/or methacrylate groups are suitable, alone or in combination with the abovementioned monomeric compounds. The proportion of isocyanates which have been partially reacted with isocyanate-reactive ethylenically unsaturated compounds is 0 to 99%, preferably 0 to 50%, more preferably 0 to 25% and most preferably 0 to 15%, based on the isocyanate component A.

It is optionally also possible for the aforementioned isocyanate component A) to contain entirely, or proportions of, isocyanates which have been reacted completely or partially with blocking agents known to the person skilled in the art from coating technology. Examples of blocking agents include: alcohols, lactams, oximes, malonic esters, alkyl acetoacetates, triazoles, phenols, imidazoles, pyrazoles and amines, for example butanone oxime, diisopropylamine, 1,2,4-triazole, dimethyl-1,2,4-triazole, imidazole, diethyl malonate, ethyl acetoacetate, acetone oxime, 3,5-dimethylpyrazole, ϵ-caprolactam, N-tert-butylbenzylamine, cyclopentanone carboxyethyl ester or any desired mixtures of these blocking agents.

As component B), it is possible in principle to use all polyfunctional, isocyanate-reactive compounds which have an average of at least 1.5 isocyanate-reactive groups per molecule.

In the context of the present invention, isocyanate-reactive groups are preferably hydroxyl, amino or thio groups; particular preference is given to hydroxyl compounds.

Suitable polyfunctional, isocyanate-reactive compounds are, for example, polyester polyols, polyether polyols, polycarbonate polyols, poly(meth)acrylate polyols and/or polyurethane polyols.

Suitable polyester polyols are, for example, linear polyester diols or branched polyester polyols, as obtained in a known manner from aliphatic, cycloaliphatic or aromatic di- or polycarboxylic acids or their anhydrides with polyhydric alcohols having an OH functionality of ≥2.

Examples of such di- or polycarboxylic acids or anhydrides are succinic acid, glutaric acid, adipic acid, pimelic acid, suberic acid, azelaic acid, sebacic acid, nonanedicarboxylic acid, decanedicarboxylic acid, terephthalic acid, isophthalic acid, o-phthalic acid, tetrahydrophthalic acid, hexahydrophthalic acid or trimellitic acid, and acid anhydrides such as o-phthalic anhydride, trimellitic anhydride or succinic anhydride, or any desired mixtures thereof with one another.

Examples of such suitable alcohols are ethanediol, di-, tri- and tetraethylene glycol, 1,2-propanediol, di-, tri- and tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

The polyester polyols may also be based on natural raw materials, such as castor oil. It is also possible for the polyester polyols to be based on homo- or copolymers of lactones, as can preferably be obtained by an addition of lactones or lactone mixtures, such as butyrolactone, ϵ-caprolactone and/or methyl-ϵ-caprolactone, onto hydroxy-functional compounds, such as polyhydric alcohols having an OH functionality of ≥2, for example of the aforementioned type.

Such polyester polyols preferably have number-average molar masses of 400 to 8000 g/mol, more preferably of 500 to 4000 g/mol. Their OH functionality is preferably 1.5 to 3.5, more preferably 1.8 to 3.0.

Suitable polycarbonate polyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned in the context of the polyester segments and having an OH functionality of >2, preferably 1,4-butanediol, 1,6-hexanediol and/or 3-methylpentanediol, or polyester polyols can also be converted into polycarbonate polyols.

Such polycarbonate polyols preferably have number-average molar masses of 400 to 4000 g/mol, more preferably of 500 to 2400 g/mol. The OH functionality of these polyols is preferably 1.8 to 3.2, more preferably 1.9 to 3.0.

Suitable polyether polyols are polyaddition products of cyclic ethers onto OH- or NH-functional starter molecules, said products optionally having a block structure.

Suitable cyclic ethers are, for example, styrene oxides, ethylene oxide, propylene oxide, tetrahydrofuran, butylene oxide, epichlorohydrin and any desired mixtures thereof.

The starters used may be the polyhydric alcohols mentioned in connection with the polyester polyols and having an OH functionality of ≥2, and also primary or secondary amines and amino alcohols.

Such polyether polyols preferably have number-average molar masses of 250 to 10 000 g/mol, more preferably of 500 to 8500 g/mol and most preferably of 600 to 4500 g/mol. The OH functionality is preferably 1.5 to 4.0, more preferably 1.8 to 3.0.

In addition, suitable constituents of component B), as polyfunctional isocyanate-reactive compounds, are also low in molecular weight, i.e. have molecular weights of less than 500 g/mol, short-chain, i.e. containing 2 to 20 carbon atoms, aliphatic, araliphatic or cycloaliphatic di-, tri- or polyfunctional alcohols.

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butyl-propanediol, trimethylpentanediol, positionally isomeric diethyloctanediols, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclo-hexyl)propane), 2,2-dimethyl-3-hydroxypropyl 2,2-dimethyl-3-hydroxypropionate. Examples of suitable triols are trimethylolethane, trimethylolpropane or glycerol. Suitable higher-functionality alcohols are ditrimethylolpropane, pentaerythritol, dipentaerythritol or sorbitol.

Preferred components B) are polyether polyols are poly(propylene oxide)s, poly(ethylene oxides) and combinations thereof in the form of random or block copolymers, and also block copolymers which are formed from propylene oxide and/or ethylene oxide and additionally contain tetrahydrofuran, butylene oxide or ε-caprolactone as monomer units, and also mixtures thereof having an OH functionality of 1.5 to 6 and a number-average molar mass of 200 to 18 000 g/mol, more preferably having an OH functionality of 1.8 to 4.0 and a number-average molar mass of 600 to 8000 g/mol, and most preferably having an OH functionality of 1.9 to 3.1 and a number-average molar mass of 650 to 4500 g/mol.

Preferred compounds for use in C) have refractive indices of greater than 1.55, more preferably 1.58.

In component C), it is possible to use compounds such as α,β-unsaturated carboxylic acid derivatives such as acrylates, methacrylates, maleates, fumarates, maleimides, acrylamides, and also vinyl ethers, propenyl ethers, allyl ethers, and compounds containing dicyclopentadienyl units, and also olefinically unsaturated compounds, for example styrene, α-methylstyrene, vinyltoluene, olefins, for example 1-octene and/or 1-decene, vinyl esters, (meth)acrylonitrile, (meth)acrylamide, methacrylic acid, acrylic acid. Preference is given to acrylates and methacrylates.

Acrylates or methacrylates generally refer to esters of acrylic acid or methacrylic acid. Examples of usable acrylates and methacrylates are methyl acrylate, methyl methacrylate, ethyl acrylate, ethyl methacrylate, ethoxyethyl acrylate, ethoxyethyl methacrylate, n-butyl acrylate, n-butyl methacrylate, test-butyl acrylate, tert-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylate, p-chlorophenyl methacrylate, p-bromophenyl acrylate, p-bromophenyl methacrylate, 2,4,6-trichlorophenyl acrylate, 2,4,6-trichlorophenyl methacrylate, 2,4,6-tribromophenyl acrylate, 2,4,6-tribromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, propane-2,2-diylbis [(2,6-dibromo-4,1-phenylene)oxy(2-{[3,3,3-tris(4-chlorophenyl)propanoyl]oxy}propane-3,1-diyl) oxyethane-2,1-diyl]diacrylate, bisphenol A diacrylate, bisphenol A dimethacrylate, tetrabromobisphenol A diacrylate, tetrabromobisphenol A dimethacrylate and the ethoxylated analog compounds thereof, N-carbazolyl acrylates, to name merely a selection of usable acrylates and methacrylates.

It is of course also possible to use urethane acrylates as component C). Urethane acrylates are understood to mean compounds having at least one acrylic ester group, and additionally having at least one urethane bond. It is known that such compounds can be obtained by reacting a hydroxyfunctional acrylic ester with an isocyanate-functional compound.

Examples of isocyanates usable for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, triphenylmethane 4,4',4"-triisocyanate and tris(p-isocyanatophenyl) thiophosphate or derivatives thereof having a urethane, urea, carbodiimide, acylurea, isocyanurate, allophanate, biuret, oxadiazinetrione, uretdione or iminooxadiazinedione structure and mixtures thereof. Preference is given to aromatic or araliphatic di-, tri- or polyisocyanates.

Useful hydroxy-functional acrylates or methaciylates for the preparation of urethane acrylates include, for example, compounds such as 2-hydroxyethyl (meth)acrylate, polyethylene oxide mono(meth)acrylates, polypropylene oxide mono(meth)acrylates, polyalkylene oxide mono(meth)-acrylates, poly(ε-caprolactone) mono(meth)acrylates, for example Tone® M100 (Dow, Schwalbach, Germany), 2-hydroxypropyl (meth)acrylate, 4-hydroxybutyl (meth)acrylate, 3-hydroxy-2,2-dimethylpropyl (meth)acrylate, hydroxypropyl (meth)acrylate, 2-hydroxy-3-phenoxypropyl acrylate, the hydroxy-functional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. Preference is given to 2-hydroxyethyl acrylate, hydroxypropyl acrylate, 4-hydroxybutyl acrylate and poly(ε-caprolactone) mono(meth) acrylates. In addition, are suitable as isocyanate-reactive oligomeric or polymeric unsaturated compounds containing acrylate and/or methacrylate groups, alone or in combination with the abovementioned monomeric compounds. It is likewise possible to use the epoxy (meth)acrylates known per se, containing hydroxyl groups and having OH contents of 20 to 300 mg KOH/g or polyurethane (meth)acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates. Preference is given to epoxy acrylates containing hydroxyl groups and having a defined hydroxy functionality. Epoxy (meth)acrylates containing hydroxyl groups are based especially on reaction products of acrylic acid and/or methacrylic acid, with epoxides (glycidyl compounds) of monomeric, oligomeric or polymeric bisphenol A, bisphenol F, hexanediol and/or butanediol or the ethoxylated and/or propoxylated derivatives thereof. Preference is further given to epoxy acrylates having a defined functionality, as can be obtained from the known reaction of acrylic acid and/or methacrylic acid and glycidyl (meth)acrylate.

Preference is given to using (meth)acrylates and/or urethane (meth)acrylates, particular preference to using (meth) acrylates and/or urethane (meth)acrylates which have at least one aromatic structural unit.

Particularly preferred compounds for use as component C) are urethane acrylates and urethane methacrylates based on aromatic isocyanates and 2-hydroxyethyl acrylate, hydroxypropyl acrylate, 4-hydroxybutyl acrylate, polyethylene oxide mono(meth)acrylate, polypropylene oxide mono(meth)acrylate, polyalkylene oxide mono(meth)acrylate and poly($\epsilon$-caprolactone) mono(meth)acrylates.

In a very particularly preferred embodiment, the component C) used comprises the addition products of aromatic triisocyanates (most preferably tris(4-phenylisocyanato)thiophosphate or trimers of aromatic diisocyanates such as tolylene diisocyanate) with hydroxyethyl acrylate, hydroxypropyl acrylate, 4-hydroxybutyl acrylate. In a further very particularly preferred embodiment, the component C) used comprises addition products of 3-thiomethylphenyl isocyanate with hydroxyethyl acrylate, hydroxypropyl acrylate, 4-hydroxybutyl acrylate.

Examples of vinylaromatics are styrene, halogenated derivatives of styrene, for example 2-chlorostyrene, 3-chlorostyrene, 4-chlorostyrene, 2-bromostyrene, 3-bromostyrene, 4-bromostyrene, p-(chloromethyl)styrene, p-(bromomethyl)styrene or 1-vinylnaphthalene, 2-vinylnaphthalene, 2-vinylanthracene, 9-vinylanthracene, 9-vinylcarbazole or difunctional compounds such as divinylbenzene.

Suitable compounds of component D) are, for example, inhibitors and antioxidants as described, for example, in "Methoden der organischen Chemie" [Methods of Organic Chemistry] (Houben-Weyl), 4th edition, Volume XIV/1, page 433 et seq., Georg Thieme Verlag, Stuttgart 1961. Suitable substance classes are, for example, phenols, for example 2,6-di-tert-butyl-4-methylphenol, cresols, hydroquinones, benzyl alcohols, for example benzhydrol, and optionally also quinones, for example 2,5-di-tert-butylquinone, and optionally also aromatic amines such as diisopropylamine or phenothiazine.

Preference is given to 2,6-di-tert-butyl-4-methylphenol, phenothiazine, p-methoxyphenol, 2-methoxy-p-hydroquinone and benzhydrol.

The component E) used comprises one or more photoinitiators. These are typically initiators which can be activated by actinic radiation and initiate polymerization of the corresponding polymerizable groups. Photoinitiators are commercially distributed compounds known per se, in the case of which a distinction is made between monomolecular (type I) and bimolecular (type II) initiators. Furthermore, depending on the chemical nature, these initiators are used for the free-radical, the anionic (or), the cationic (or mixed) forms of the aforementioned polymerizations. (Type I) systems for free-radical photopolymerization are, for example, aromatic ketone compounds, e.g. benzophenones, in combination with tertiary amines, alkylbenzophenones, 4,4'-bis(dimethylamino)benzophenone (Michler's ketone), anthrone and halogenated benzophenones or mixtures of said types. More suitable are (type II) initiators, such as benzoin and its derivatives, benzil ketals, acylphosphine oxides, e.g. 2,4,6-trimethylbenzoyldiphenylphosphine oxide, bisacylophosphine oxide, phenylglyoxylic esters, camphorquinone, alpha-aminoalkylphenones, alpha,alpha-dialkoxyacetophenone, 1-[4-(phenylthio)phenyl]octane-1,2-dione 2-(O-benzoyloxime) and alpha-hydroxyalkylphenone. The photoinitiator systems which are described in EP-A 0223587 and consist of a mixture of an ammonium arylborate and one or more dyes can also be used as a photo initiator. For example, tetrabutylammonium triphenylhexylborate, tetrabutylammonium tris (3-fluorophenyl)hexylborate and tetrabutylammonium tris (3-chloro-4-methylphenyl)hexylborate are suitable as an ammonium arylborate. Suitable dyes are, for example, new methylene blue, thionine, basic yellow, pinacynol chloride, rhodamine 6G, gallocyanine, ethyl violet, victoria blue R, celestine blue, quinaldine red, crystal violet, brilliant green, astrazone orange G, darrow red, pyronine Y, basic red 29, pyrillium I, cyanine and methylene blue, azure A (Cunningham et al., RadTech '98 North America UV/EB Conference Proceedings, Chicago, Apr. 19-22, 1998).

The photoinitiators used for the anionic polymerization are generally (type I) systems and derive from transition metal complexes of the first series. Known photoinitiators here are chromium salts, for example trans-$Cr(NH_3)_2(NCS)_4^-$ (Kutal et al, Macromolecules 1991, 24, 6872) or ferrocenyl compounds (Yamaguchi et al. Macromolecules 2000, 33, 1152). A further means of anionic polymerization consists in the use of dyes, such as crystal violet leuconitrile or malchite green leuconitrile, which can polymerize cyanoacrylates by photolytic decomposition (Neckers et al. Macromolecules 2000, 33, 7761). However, this incorporates the chromophore into the polymer, such that the resulting polymers are colored throughout.

The photoinitiators used for the cationic polymerization consist essentially of three classes: aryldiazonium salts, onium salts (here especially: iodonium, sulfonium and selenonium salts) and organometallic compounds. When irradiated either in the presence or in the absence of a hydrogen donor, phenyldiazonium salts can produce a cation that initiates the polymerization. The efficiency of the overall system is determined by the nature of the counterion used for the diazonium compound. Preference is given here to the relatively unreactive but quite expensive $SbF_6^-$, $AsF_6^-$ or $PF_6^-$. These compounds are generally not very suitable for use in coating of thin films, since the nitrogen liberated after the exposure reduces the surface quality (pinholes) (Li et al., Polymeric Materials Science and Engineering, 2001, 84, 139). Onium salts, especially sulfonium and iodonium salts, are very widely used, and also commercially available in a variety of forms. The photochemistry of these compounds has been investigated over a long period. The iodonium salts decompose, at first homolytically, after excitation and thus produce a free radical and a free-radical cation which is stabilized by hydrogen abstraction, releases a proton and then initiates the cationic polymerization (Dektar et al. J. Org. Chem. 1990, 55, 639; J. Org. Chem., 1991, 56, 1838). This mechanism enables the use of iodonium salts likewise for free-radical photopolymerization. In this context, the selection of the counterion is of great importance; preference is likewise given to the quite expensive $SbF_6^-$, $AsF_6^-$ or $PF_6^-$. In this structure class, the selection of the substitution of the aromatic is otherwise quite unrestricted and is determined substantially by the availability of suitable starting units for the synthesis. The sulfonium salts are compounds which decompose according to Norrish(II) (Crivello et al., Macromolecules, 2000, 33, 825). In the case of sulfonium salts too, the selection of the counterion is of critical importance, which manifests itself substantially in the curing rate of the polymers. The best results are generally achieved with $SbF_6^-$ salts. Since the intrinsic absorption of iodonium and sulfonium salts is at <300 nm, these compounds have to be sensitized appropriately for the photopolymerization with near UV or short-wave visible light. This is accomplished by the use of relatively highly absorbing aromatics, for example anthracene and derivatives (Gu et al., Am. Chem. Soc. Polymer Preprints, 2000, 41 (2), 1266) or phenothiazine or derivatives thereof (Hua et al, Macromolecules 2001, 34, 2488-2494).

It may be advantageous also to use mixtures of these compounds. Depending on the radiation source used for the curing, type and concentration of photoinitiator must be adapted in a manner known to a person skilled in the art. The aforementioned adjustment with regard to the photopolymerization is readily possible for a person skilled in the art in the form of routine tests within the ranges of amounts specified below for the components, and also the formation components available in each case, especially those preferred.

Preferred photoinitiators E) are mixtures of tetrabutylammonium tetrahexylborate, tetrabutylammonium triphenylhexylborate, tetrabutylammonium tris(3-fluorophenyl)hexylborate and tetrabutylammonium tris(3-chloro-4-methylphenyl)hexylborate, with dyes, for example astrazone orange G, methylene blue, new methylene blue, azure A, pyrillium I, safranin O, cyanine, gallocyanine, brilliant green, crystal violet, ethyl violet and thionine.

As compounds of component F), it is optionally possible to use one or more catalysts. These are catalysts for accelerating the urethane formation. Known catalysts for this purpose are, for example, tin octoate, zinc octoate, dibutyltin dilaurate, dimethylbis[(1-oxoneodecyl)oxy]-stannane, dimethyltin dicarboxylate, zirconium bis(ethylhexanoate), zirconium acetylacetonate or tertiary amines, for example 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido(1,2-a)pyrimidine.

Preference is given to dibutyltin dilaurate, dimethylbis[(1-oxoneodecyl)oxy]stannane, dimethyltin dicarboxylate, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido(1,2-a)pyrimidine.

Of course, it is optionally possible to use further additives G). These may be, for example, additives customary in the area of coating technology, such as solvents, plasticizers, leveling agents or adhesion promoters. The plasticizers used are preferably liquids with good dissolution properties, low volatility and high boiling temperature. It may also be advantageous simultaneously to use a plurality of additives of one type. Of course, it may also be advantageous to use a plurality of additives of a plurality of types.

Typical polyurethane compositions comprise:
1 to 60% by weight of components A) essential to the invention,
5 to 93.999% by weight of component B),
5 to 70% by weight of component C),
0.001 to 10% by weight of photoinitiators E),
0 to 10% by weight of free-radical stabilizers D),
0 to 4% by weight of catalysts F),
0 to 70% by weight of assistants and additives G).

The inventive polyurethane compositions preferably comprise:
10 to 55% by weight of components A) essential to the invention,
15 to 79.989% by weight of component B),
10 to 70% by weight of component C),
0.01 to 7.5% by weight of photoinitiators E),
0.001 to 2% by weight of free-radical stabilizers D),
0 to 3% by weight of catalysts F),
0 to 50% by weight of assistants and additives G).

The inventive polyurethane compositions more preferably comprise:
15 to 50% by weight of components A) essential to the invention,
25 to 69.489% by weight of component B),
15 to 50% by weight of component C),
0.5 to 5% by weight of photoinitiators E),
0.01 to 0.5% by weight of free-radical stabilizers D),
0.001 to 2% by weight of catalysts F),
0 to 35% by weight of assistants and additives G).

The present invention therefore further provides a process for producing media for recording visual holograms, in which such photopolymer formulations are applied to a substrate or to a mold and cured. The invention likewise provides the media thus obtainable.

The process according to the invention is preferably performed in such a way that the formation components of the inventive polyurethane compositions, except for component A), are mixed homogeneously with one another, and component A) is not added until immediately before the application to the substrate or in the mould.

For the mixing, it is possible to use all methods and apparatus known per se to the person skilled in the art from mixing technology, for example stirred tanks or either dynamic or static mixers. Preference is given, however, to apparatus with only a low level of dead spaces, if any. Preference is further given to methods in which the mixing is effected within a very short time and with very vigorous mixing of the two components to be mixed. Especially suitable for this purpose are dynamic mixers, especially those in which the components do not come into contact with one another until within in the mixer.

The temperatures here are 0 to 100° C., preferably 10 to 80° C., more preferably 20 to 60° C.

If necessary, it is also possible to perform devolatilization of the individual components or of the overall mixture under a reduced pressure of, for example, 1 mbar. Devolatilization, especially after addition of component A), is preferred for prevention of bubble formation by residual gases in the media obtainable.

Before addition of component A), the mixtures can be stored as a storage-stable intermediate, optionally over several months.

After the addition of component A) of the inventive polyurethane compositions, a clear liquid formulation is obtained, which, depending on the composition, cures at room temperature within a few seconds to a few hours.

The ratio and the type and reactivity of the formation components of the polyurethane compositions is preferably adjusted such that the curing after addition of component A) occurs at room temperature within minutes up to one hour. In a preferred embodiment, the curing is accelerated by heating the formulation after the addition to temperatures between 30 and 180° C., preferably 40 to 120° C., more preferably 50 to 100° C.

The aforementioned approach with regard to the curing behavior is easily possible for a person skilled in the art easily in the form of routine experiments within the above-specified range of the components and of the formation components available in each case for selection, especially the preferred formation components.

The inventive polyurethane compositions have, immediately after complete mixing of all components, viscosities at 25° C. of typically 10 to 100 000 mPas, preferably 100 to 20 000 mPas, more preferably 200 to 10 000 mPas, especially preferably 500 to 5000 mPas, such that they have very good processing properties even in solvent-free form. In solution with suitable solvents, it is possible to establish viscosities at 25° C. below 10 000 mPas, preferably below 2000 mPas, particularly preferably below 500 mPas.

Advantageous polyurethane compositions of the aforementioned type have been found to be those which cure in less than 4 hours at 25° C. in an amount of 15 g and with a catalyst content of 0.004% by weight, or cure in less than 10 minutes at 25° C. with a catalyst content of 0.02% by weight.

For application to a substrate or to a mold, suitable methods have been found to be all customary methods known to persons skilled in the art for each purpose, such as, in particular, knife coating, casting, printing, screen printing, spraying or inkjet printing.

The present invention therefore further provides for the use of the inventive media for recording of visual holograms, for production of optical elements, images, representations and a process for recording holograms using the inventive polyurethane compositions, and media or holographic films obtainable therefrom.

The inventive polyurethane compositions can be used to produce, by appropriate exposure processes, holograms for optical applications in the entire visible and near UV ranges (300-800 nm). Visual holograms include all holograms which can be recorded by methods known to the person skilled in the art, including in-line (Gabor) holograms, off-axis holograms, full-aperture transfer holograms, white light transmission holograms ("rainbow holograms"), Denisyuk holograms, off-axis reflection holograms, edge-lit holograms and holographic stereograms; preference being given to reflection holograms, Denisyuk holograms and transmission holograms. Preference is given to optical elements such as lenses, mirrors, deflecting mirrors, filters, diffusion discs, diffraction elements, light conductors, waveguides, projection screens and/or masks have. Frequently, these optical elements show a frequency selectivity, depending on how the holograms were exposed and which dimensions the hologram has.

In addition, the inventive polyurethane compositions can also be used to produce holographic images or representations, for example for personal portraits, biometric representations in security documents, or generally images or image structures for advertising, security labels, brand protection, branding, labels, design elements, decorations, illustrations, collectable cards, images and the like, and images which can represent digital data, including in combination with the products described above. Holographic images can have the impression of a three-dimensional image, but they can also show image sequences, short films or a number of different objects, depending on the angle from which they are illuminated, the light source with which they are illuminated (including moving ones), etc. Owing to these various possible designs, holograms, especially volume holograms, are an attractive technical solution for the abovementioned application.

EXAMPLES

The examples which follow are cited for illustration of the inventive photopolymers, but should not be understood in a restrictive manner. Unless noted otherwise, all percentages relate to percent by weight.

Desmodur® XP 2410 is a test product from Bayer MaterialScience AG, Leverkusen, Germany, hexane diisocyanate-based polyisocyanate, proportion of iminooxadiazinedione at least 30%, NCO content: 23.5%

Desmodur® XP 2599 is a test product from Bayer MaterialScience AG, Leverkusen, Germany, full allophanate of hexane diisocyanate on Acclaim 4200, NCO content: 5.6-6.4%

Prepolymer 1 is an experimental product from Bayer MaterialScience AG, Leverkusen, Germany, full allophanate of hexane diisocyanate on Acclaim 4200, NCO content: 3.1%

Prepolymer 2 is an experimental product from Bayer MaterialScience AG, Leverkusen, Germany, full allophanate of TMDI on Acclaim 2200, NCO content: 4.35%

Prepolymer 3 is an experimental product from Bayer MaterialScience AG, Leverkusen, Germany, full allophanate of hexane diisocyanate and Acclaim 8200, NCO content: 1.88-1.92%

Prepolymer 4 is an experimental product from Bayer MaterialScience AG, Leverkusen, Germany, urethane of hexane diisocyanate and Acclaim 2200, NCO content: 3.2-3.75%

Polyol 1 is an experimental product from Bayer MaterialScience A G, Leverkusen, Germany, block copolymer of Terathane® 1000 and ε-caprolactone.

Polyol 2 is a difunctional poly(ε-caprolactone) polyol (number-average molar mass approx. 650 g/mol).

Urethane acrylate 1 is an experimental product from Bayer MaterialScience AG, Leverkusen, Germany, urethane acrylate based on HEA and Desmodur® RFE.

Fomrez® UL28: urethanization catalyst, dimethylbis[(1-oxoneodecyl)oxy]stannane, commercial product from Momentive Performance Chemicals, Wilton, Conn., USA (used as a 10% solution in M-ethylpyrrolidone).

CGI 909 is a test product sold in 2008 by Ciba Inc., Basel, Switzerland.

Analysis of diffraction efficiency DE and refractive index contrast Δn:

The inventive and comparative media produced in the experimental part were tested with regard to their holographic properties by means of an analysis setup according to FIG. 1:

FIG. 1: Geometry or a holographic media tester at λ=633 nm (He—Ne laser) for writing of a reflection hologram: M=mirror, S=shutter, SF=spatial filter, CL=collimator lens, λ/2=λ/2 plate, PBS=polarization-sensitive beam splitter, D=detector, I=iris aperture, α=21.8° and β=41.8° are the angles of incidence of the coherent beams outside the sample (the medium).

The beam of an He—Ne laser (emission wavelength 633 nm) was converted with the aid of the spatial filter (SF) and, together with the collimation lens (CL), to a parallel homogeneous beam. The final cross sections of the signal and reference beam are fixed by the iris apertures (I). The diameter of the iris aperture opening is 4 mm. The polarization-dependent beam splitters (PBS) split the laser beam into two coherent beams with the same polarization. The λ/2 plates were used to adjust the power of the reference beam to 0.5 mW, and the power of the signal beam to 0.65 mW. The powers were determined with the semiconductor detectors (D) with sample removed. The angle of incidence (α) of the reference beam is 21.8°; the angle of incidence (β) of the signal beam is 41.8°. At the location of the sample (medium), the interference field of the two overlapping beams produced a grating of light and dark strips which are perpendicular to the angle bisector of the two beams incident on the sample (reflection hologram). The strip spacing in the medium is ~225 mu (refractive index of the medium assumed to be ~1.49).

Holograms are written into the medium in the following manner:

Both shutters (S) are opened for the exposure time t. Thereafter, with the shutters (S) closed, the medium was allowed 5 minutes for diffusion of the as yet unpolymerized writing monomers. The holograms written were now read in the following manner. The shutter of the signal beam remained closed. The shutter of the reference beam was opened. The iris aperture of the reference beam was closed to a diameter of <1 mm. This ensured that the beam was always completely within the previously written hologram for all angles of rotation (Ω) of the medium. The turntable, under computer control, then covered the angle range from Ω=0° to Ω=20° with an angle step width of 0.05°. At each angle step, the powers of the beam transmitted in the zeroth order were measured by means of the corresponding detector D and the powers of the beam diffracted in the first order were measured by means of the detector D. The diffraction efficiency η was obtained at each angle step Ω as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (which describes the diffraction efficiency η as a function of the angle of rotation Ω of the written hologram) was measured and saved in a computer. In addition, the intensity transmitted in the zeroth order was plotted against the angle of rotation Ω and saved in a computer.

The maximum diffraction efficiency (DE=$\eta_{max}$) of the hologram, i.e. its peak value, was determined. It may have been necessary for this purpose to change the position of the detector of the diffracted beam in order to determine this maximum value:

The refractive index contrast Δn and the thickness d of the photopolymer layer was now determined by means of the coupled wave theory (cf. H. Kogelnik, The Bell System Technical Journal, Volume 48, November 1969, Number 9 page 2909—page 2947) from the measured Bragg curve and the variation of the transmitted intensity as a function of angle. The method is described below:

According to Kogelnik, for the Bragg curve η(Ω) of a reflection hologram:

$$\eta = \frac{1}{1 + \frac{1-(\chi/\Phi)^2}{\sinh^2(\sqrt{\Phi^2 - \chi^2})}}$$

with:

$$\Phi = \frac{\pi \cdot \Delta n \cdot d}{\lambda \cdot \sqrt{\cos(\alpha') \cdot \cos(\alpha' - 2\psi)}}$$

-continued $$\chi = \Delta\theta \cdot \frac{2\pi \cdot \sin(\alpha' - \psi)}{\Lambda \cdot \cos(\alpha' - 2\psi)} \cdot \frac{d}{2}$$

$$\psi = \frac{\beta' - \alpha'}{2}$$

$$\Lambda = \frac{\lambda}{2 \cdot n \cdot \cos(\psi - \alpha')}$$

$$n \cdot \sin(\alpha') = \sin(\alpha), \, n \cdot \sin(\beta') = \sin(\beta)$$

$$\Delta\theta = -\Delta\Omega \cdot \sqrt{\frac{1 - \sin^2(\alpha)}{n^2 - \sin^2(\alpha)}}$$

Φ is the grating thickness, χ is the detuning parameter and ψ is the angle of tilt of the refractive index grating which was written. α' and β' correspond to the angles α and β during writing of the hologram, but measured in the medium. ΔΘ is the angle detuning measured in the medium, i.e. the deviation from the angle α'. ΔΩ is the angle detuning measured outside the medium, i.e. the deviation from the angle α. n is the mean refractive index of the photopolymer and was set at 1.504.

The maximum diffraction efficiency (DE=$\eta_{max}$) is then calculated for χ=0, i.e. ΔΩ=0, as:

$$DE = \tanh^2(\Phi) = \tanh^2\left(\frac{\pi \cdot \Delta n \cdot d}{\lambda \cdot \sqrt{\cos(\alpha') \cdot \cos(\alpha' - 2\psi)}}\right)$$

Figure 2:
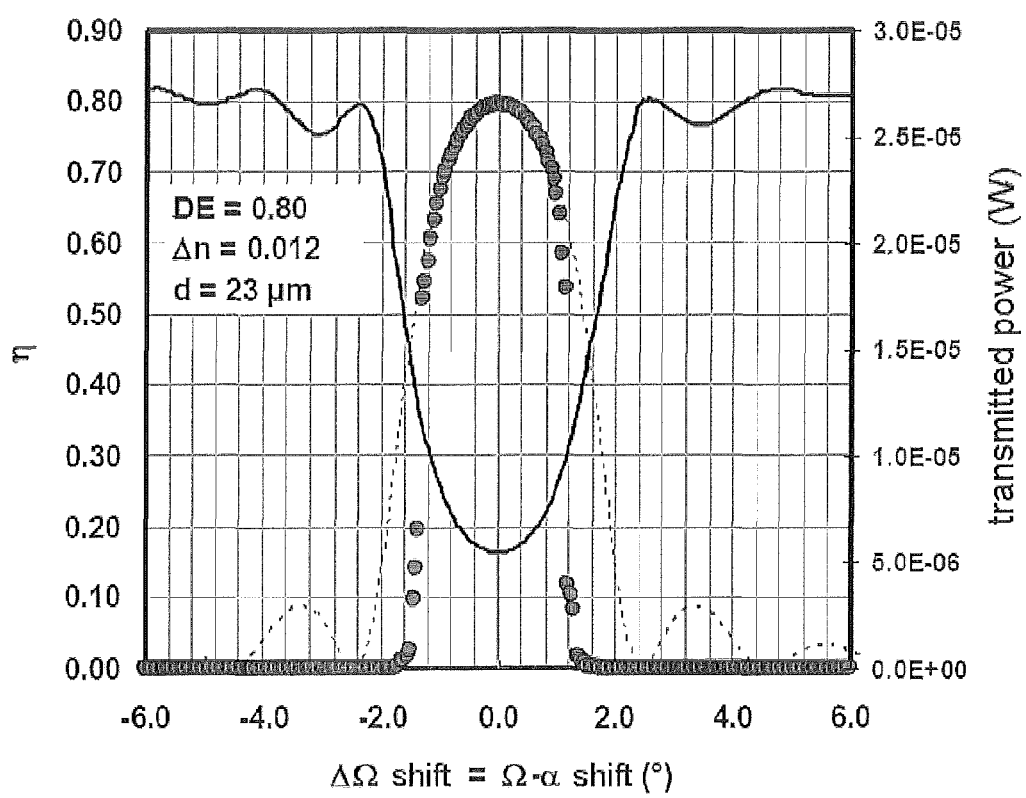
FIG. 2 illustrates measured data of the diffraction efficiency, the theoretical Bragg curve and the transmitted intensity.

The measured data of the diffraction efficiency, the theoretical Bragg curve and the transmitted intensity are, as shown in FIG. 2, plotted against the centered angle of rotation Ω-α shift. Since, owing to geometric shrinkage and the change in the mean refractive index during the photopolymerization, the angle at which DE is measured differs from α, the x axis is centered around this shift. The shift is typically 0° to 2°.

Since DE is known, the shape of the theoretical Bragg curve according to Kogelnik is determined only by the thickness d of the photopolymer layer. Δn is subsequently corrected via DE for a given thickness d such that measurement and theory of DE always agree. d is now adjusted until the angle positions of the first secondary minima of the theoretical Bragg curve agree with the angle positions of the first secondary maxima of the transmitted intensity, and the full width at half maximum (FWHM) for the theoretical Bragg curve and the transmitted intensity additionally agree.

Since the direction in which a reflection hologram also rotates when reconstructed by means of an Ω scan, but the detector for the diffracted light can detect only a finite angle range, the Bragg curve of broad holograms (small d) is not completely detected in an Ω scan, but only the central region, with suitable detector positioning. Therefore, that shape of the transmitted intensity which is complementary to the Bragg curve is additionally used for adjustment of the layer thickness d.

FIG. 2: Plot of the Bragg curve η according to Kogelnik (broken line), of the measured diffraction efficiency (solid circles) and of the transmitted power (black solid line) against the angle detuning ΔΩ. Since, owing to geometric shrinkage and the change in the average refractive index during the photopolymerization, the angle at which DE is measured differs from α, the x axis is centered around this shift. The shift is typically 0° to 2°.

For a formulation, this procedure may have been repeated several times for different exposure times t on different media in order to determine the mean energy dose of the incident laser beam at which DE reaches the saturation value during writing of the hologram. The mean energy dose E is calculated as follows:

$$E(\text{mJ/cm}^2) = \frac{2 \cdot \lfloor P_\alpha + P_\beta \rfloor \cdot t(s)}{\pi \cdot 0.4^2 \text{ cm}^2}$$

The powers of the beam components were adjusted such that the same power density is achieved in the medium at the angles α and β used.

Preparation of Polyol 1:

A 1 l flask was initially charged with 0.18 g of tin octoate, 374.8 g of ε-caprolactone and 374.8 g of a difunctional polytetrahydrofuran polyether polyol (equivalent weight 500 g/mol of OH), which were heated to 120° C. and held at this temperature until the solids content (proportion of nonvolatile constituents) was at 99.5% by weight or higher. This was followed by cooling to obtain the product as a waxy solid.

Preparation of the Urethane Acrylate 1:

A 500 ml round-bottomed flask was initially charged with 0.1 g of 2,6-di-tert-butyl-4-methylphenol, 0.05 g of dibutyltin dilaurate (Desmorapid Z, Bayer MaterialScience AG, Leverkusen, Germany) and 213.07 g of a 27% solution of tris(p-isocyanatophenyl) thiophosphate in ethyl acetate (Desmodur® RFE, product from Bayer MaterialScience AG, Leverkusen, Germany), which were heated to 60° C. Subsequently, 42.37 g of 2-hydroxyethyl acrylate were added dropwise and the mixture continued to be held at 60° C. until the isocyanate content had fallen below 0.1%. This was followed by cooling and complete removal of the ethyl acetate under reduced pressure. The product was obtained as a partly crystalline solid.

Preparation of Prepolymer 1:

A round-bottomed flask was initially charged with 378.0 g of hexamethylene diisocyanate (HDI) while stirring and sparging with $N_2$, and 0.019 g of isophthaloyl chloride was added. The mixture was heated to 100° C., and 576.36 g of Acclaim 4200 (polypropylene oxide of number-average molar mass 4000 g/mol) were added over the course of 3 hours. The mixture was stirred until an NCO value of 18.5% NCO was attained, then cooled to 90° C., and 0.076 g of zinc bis-2-ethylhexanoate was added. The mixture was stirred until the theoretical target NCO value had been attained (17.2% NCO). The reaction was then stopped by cooling to room temperature and adding 0.095 g of isophthaloyl chloride. Then the excess HDI was removed by distillation using a thin-film evaporator at 140° C. (residual HDI<0.03%). The product is obtained as a yellowish liquid.

Preparation of Prepolymer 2:

A round-bottomed flask was initially charged with 236.25 g of 2,2,4-trimethylhexamethylene diisocyanate (TMDI) while stirring and sparging with $N_2$, and 0.008 g of isophthaloyl chloride was added. The mixture was heated to 100° C., and 167.67 g of Acclaim 2200 (polypropylene oxide of number-average molar mass 2000 g/mol) were added over the course of 3 hours. The mixture was stirred until an NCO value of 21.8% NCO was attained, then cooled to 90° C., and 0.077 g of zinc bis-2-ethylhexanoate was added. The mixture was stirred until the theoretical target NCO value had been attained (20.3% NCO). Then the reaction was then stopped by cooling to room temperature. Then the excess HDI was removed by distillation using a thin-film evaporator at 140° C. (residual TMDI<0.12%). The product is obtained as a colorless liquid.

Preparation of Prepolymer 3:

400 g of HDI (hexamethylene diisocyanate) and 0.06 g of zinc octoate are initially charged in a 4 l four-neck flask while stirring at 110° C. Within 1.5 hours, 1570 g of difunctional polypropylene glycol of number-average molar mass 8000 g/mol are added in such a way that a temperature of 115° C. is maintained. After 2 further hours at the same temperature, 0.06 g of dibutyl phosphate is added and then the mixture is cooled to 75° C. At this temperature, the mixture is filtered. Then 700 g of HDI (hexamethylene diisocyanate) and 0.5 g of benzoyl chloride are added. Subsequently, the excess HDI is distilled off by thin-film distillation at 130° C. and 0.1 torr. The resulting prepolymer has an NCO content of 1.92% and a viscosity of approx. 8000 mPas (25° C.).

Preparation of Prepolymer 4:

1300 g of HDI (hexamethylene diisocyanate), 1.3 g of benzoyl chloride and 1.3 g of methyl para-toluenesulfonate are initially charged in a 4 l four-neck flask while stirring. Within 3 hours, 1456 g of a difunctional polypropylene glycol polyether having a number-average molecular weight of 2000 g/mol are added at 80° C., and the mixture is stirred at the same temperature for a further 1 hour. Subsequently, the excess HDI was distilled off by thin-film distillation at 130° C. and 0.1 torr. The resulting prepolymer has an NCO content of 3.23% and a viscosity of 1650 mPas (25° C.).

To produce the holographic media, component C, component D (which may already be predissolved in component C) and optionally component G are dissolved in component B, optionally at 60° C., then glass beads of size 20 μm (for example from Whitehouse Scientific Ltd, Waverton, Chester, CH3 7PB, United Kingdom) are added and the mixture is mixed thoroughly. Thereafter, in the dark or with suitable illumination, component E is weighed in in pure form or in a dilute solution in NEP, and the mixture is mixed again for 1 minute. Optionally, the mixture is heated to 60° C. in a drying cabinet for a maximum of 10 minutes. Then component A is added and the mixture is mixed again for 1 minute. Thereafter, a solution of component F is added and the mixture is mixed again for 1 minute. The resulting mixture is devolatilized while stirring at <1 mbar for a maximum of 30 seconds, then it is distributed onto glass plates of 50×75 mm, each of which is covered with a further glass plate. The PU formulation is cured under 15 kg weights over the course of several hours (usually overnight). Some of the media are subjected to post-curing in opaque packaging at 60° C. for another 2 hours. The thickness d of the photopolymer layer arises from the diameter of the glass spheres used and is 20 μm. Since different formulations with different starting viscosity and different curing rate of the matrix do not always lead to the same layer thicknesses d of the photopolymer layer, d is determined separately for each sample using the characteristics of the written holograms.

Comparative Example 1 (Medium)

8.89 g of the polyol 1 prepared as described above (component B) were mixed with 3.75 g of urethane acrylate 1 (component C), 0.15 g of CGI 909 and 0.015 g of new methylene blue (together, component E) at 60° C., and 0.525 g of N-ethylpyrrolidone (component G), such that a clear solution was obtained. Subsequently, the mixture was cooled to 30° C., 1.647 g of Desmodur® XP 2410 (comparative for component A) were added and the mixture was mixed again. Finally, 0.009 g of Fomrez UL 28 (component F) was added, and the mixture was mixed again briefly. The resulting liquid material was then applied to a glass plate and covered there with a second glass plate which was kept at a distance of 20

μm by means of spacers. This sample specimen was left to stand at room temperature and cured over the course of 16 hours. Maximum Δn: 0.0101.

Comparative Example 2 (Medium)

6.117 g of polyol 2 (component B) were mixed with 3.75 g of urethane acrylate 1 (component C), 0.15 g of CGI 909 and 0.015 g of new methylene blue (together, component E) at 60° C., and 0.525 g of N-ethylpyrrolidone (component G), such that a clear solution was obtained. Subsequently, the mixture was cooled to 30° C., 4.418 g of Baytec® WE 180 (comparative for component A) were added, and the mixture was mixed again. Finally, 0.030 g of Fomrez® UL 28 (component F) was added, and the mixture was mixed again briefly. The resulting liquid material was then applied to a glass plate and covered there with a second glass plate, which was kept at a distance of 20 μm by spacers. This sample specimen was left to stand at room temperature and cured over the course of 16 hours. Maximum Δn: 0.0063.

Example 1 (Medium)

7.743 g of Acclaim® 4200 (polypropylene oxide of number-average molar mass 4000 g/mol) (component B) were mixed with 3.75 g of urethane acrylate 1 (component C), 0.15 g of CGI 909 and 0.015 g of new methylene blue (together, component E) at 60° C., and 0.525 g of N-ethylpyrrolidone (component G), such that a clear solution was obtained. Subsequently, the mixture was cooled to 30° C., 2.792 g of Desmodur® XP 2599 (component A) were added, and the mixture was mixed again. Finally, 0.0245 g of Fomrez® UL 28 (component F) was added, and the mixture was mixed again briefly. The resulting liquid material was then applied to a glass plate and covered there with a second glass plate which was kept at a distance of 20 μm by spacers. This sample specimen was left to stand at room temperature and cured over the course of 16 hours. Maximum Δn: 0.0158.

Example 2 (Medium)

5.63 g of polyether L 5050 (difunctional copolyether formed from ethylene oxide and propylene oxide with ethylene oxide component totaling 50% by weight and of equivalent weight 984.2 g/mol) (component B) were mixed with 4.50 g of urethane acrylate I (component C), 0.15 g of CGI 909 and 0.015 g of new methylene blue (together, component E) at 60° C., and 0.525 g of N-ethylpyrrolidone (component G), such that a clear solution was obtained. Subsequently, the mixture was cooled to 30° C., 4.154 g of Desmodur® XP 2599 (component A) were added, and the mixture was mixed again. Finally, 0.0323 g of Fomrez® UL 28 (component F) was added, and the mixture was mixed again briefly. The resulting liquid material was then applied to a glass plate and covered there with a second glass plate which was kept at a distance of 20 μm by spacers. This sample specimen was left to stand at room temperature and cured over the course of 16 hours. Maximum Δn: 0.0142.

Example 3 (Medium)

7.554 g of Acclaim® 4220 N (ethylene oxide-capped polypropylene oxide of number-average molar mass 4000 g/mol) (component B) were mixed with 3.75 g of urethane acrylate 1 (component C), 0.15 g of CGI 909 and 0.015 g of new methylene blue (together, component E) at 60° C., and 0.525 g of N-ethylpyrrolidone (component G), such that a clear solution was obtained. Subsequently, the mixture was cooled to 30° C., 2.983 g of Desmodur® XP 2599 (component A) were added, and the mixture was mixed again. Finally, 0.0071 g of Fomrez® UL 28 (component F) was added, and the mixture was mixed again briefly. The resulting liquid material was then applied to a glass plate and covered there with a second glass plate which was kept at a distance of 20 μm by spacers. This sample specimen was left to stand at room temperature and cured over the course of 16 hours. Maximum Δn: 0.0141.

Example 4 (Medium)

6.128 g of Acclaim® 4200 (polypropylene oxide of number-average molar mass 4000 g/mol) (component B) were mixed with 3.75 g of urethane acrylate 1 (component C), 0.15 g of CGI 909 and 0.015 g of new methylene blue (together, component E) at 60° C., and 0.525 g of N-ethylpyrrolidone (component G), such that a clear solution was obtained. Subsequently, the mixture was cooled to 30° C., 4.408 g of prepolymer 1 (component A) were added, and the mixture was mixed again. Finally, 0.0150 g of Fomrez® UL 28 (component F) was added, and the mixture was mixed again briefly. The resulting liquid material was then applied to a glass plate and covered there with a second glass plate which was kept at a distance of 20 μm by spacers. This sample specimen was left to stand at room temperature and cured over the course of 16 hours. Maximum Δn: 0.0147.

Example 5 (Medium)

6.965 g of Acclaim® 4200 (polypropylene oxide of number-average molar mass 4000 g/mol) (component B) were mixed with 3.75 g of urethane acrylate 1 (component C), 0.15 g of CGI 909 and 0.015 g of new methylene blue (together, component E) at 60° C., and 0.525 g of M-ethylpyrrolidone (component G), such that a clear solution was obtained. Subsequently, the mixture was cooled to 30° C., 3.570 g of prepolymer 2 (component A) were added, and the mixture was mixed again. Finally, 0.0293 g of Fomrez® UL 28 (component F) was added, and the mixture was mixed again briefly. The resulting liquid material was then applied to a glass plate and covered there with a second glass plate which was kept at a distance of 20 μm by spacers. This sample specimen was left to stand at room temperature and cured over the course of 16 hours. Maximum Δn: 0.0150.

Example 6 (Medium)

4.819 g of Acclaim® 4200 (polypropylene oxide of number-average molar mass 4000 g/mol) (component B) were mixed with 3.75 g of urethane acrylate 1 (component C), 0.15 g of CGI 909 and 0.015 g of new methylene blue (together, component E) at 60° C., and 0.525 g of M-ethylpyrrolidone (component G), such that a clear solution was obtained. Subsequently, the mixture was cooled to 30° C., 5.716 g of prepolymer 3 (component A) were added, and the mixture was mixed again. Finally, 0.0252 g of Fomrez® UL 28 (component F) was added, and the mixture was mixed again briefly. The resulting liquid material was then applied to a glass plate and covered there with a second glass plate which was kept at a distance of 20 μm by spacers. This sample specimen was left to stand at room temperature and cured over the course of 16 hours. Maximum Δn: 0.0211.

Example 7 (Medium)

5.497 g of Acclaim® 2200 (polypropylene oxide of number-average molar mass 2000 g/mol) (component B) were mixed with 3.75 g of urethane acrylate 1 (component C), 0.15 g of CGI 909 and 0.015 g of new methylene blue (together, component E) at 60° C., and 0.525 g of N-ethylpyrrolidone (component G), such that a clear solution was obtained. Subsequently, the mixture was cooled to 30° C., a mixture of 1.783 g of Desmodur® XP 2599 and 3.254 g of prepolymer 4 (together, component A) were added, and the mixture was mixed again. Finally, 0.030 g of Fomrez® UL 28 (component F) was added, and the mixture was mixed again briefly. The resulting liquid material was then applied to a glass plate and covered there with a second glass plate which was kept at a distance of 20 μm by spacers. This sample specimen was left to stand at room temperature and cured over the course of 16 hours. Maximum Δn: 0.0168.

The invention claimed is:

1. A polyurethane composition consisting of
A) 10 to 55% by weight of a polyisocyanate component comprising an exclusively diol-based NCO-terminated polyurethane prepolymer, wherein the NCO groups are bonded in a primary manner, and wherein the prepolymer comprises a residual contents of free monomeric isocyanate of less than 0.5% by weight,
B) 15 to 79.989% by weight of an isocyanate-reactive polymer,
C) 10 to 70% by weight of a compound having groups which react by polymerizing with an ethylenically unsaturated compound under the action of actinic radiation (radiation-curing groups) wherein the compound is free of NCO groups,
D) from 0.001 to 2% by weight of a free-radical stabilizer,
E) from 0.01 to 7.5% by weight of a photoinitiator,
F) optionally up to 3% by weight of a catalyst,
G) optionally up to 50% by weight of assistants and additives.

2. The polyurethane composition as claimed in claim 1, wherein the prepolymer in A) comprises NCO-functional prepolymers having groups selected from the group consisting of urethane, allophanate, biuret, amide and mixtures thereof.

3. The polyurethane composition as claimed in claim 1, wherein the prepolymer in A) comprises urethanes, allophanates, and biurets which are formed from an aliphatic isocyanate-functional compound and oligomeric polyols, polymeric polyols, or polyamines having a number-average molar mass from 500 to 8500 g/mol.

4. The polyurethane composition as claimed in claim 1, wherein the prepolymer in A) comprises allophanates formed from HDI or TMDI and difunctional polyether polyols having a number-average molar mass from 1000 to 8200 g/mol.

5. The polyurethane composition as claimed in claim 1, wherein the isocyanate reactive polymer in B) comprises homopolymers or random or block copolymers based on ethylene oxide, propylene oxide, or mixtures thereof, optionally in combination with tetrahydrofuran, butylene oxide or ε-caprolactone as monomer units, wherein the homopolymers or random or block copolymers have an OH functionality from 1.5 to 6 and a number-average molar mass from 200 to 18000 g/mol.

6. The polyurethane composition as claimed in claim 1, wherein the compound in C) has a refractive index $n_D^{20}$ of greater than 1.55.

7. The polyurethane composition as claimed in claim 1, wherein the compound in C) comprises a urethane acrylate or a urethane methacrylate which is based on an aromatic isocyanate and a compound selected from the group consisting of 2-hydroxyethyl acrylate, hydroxypropyl acrylate, 4-hydroxybutyl acrylate, polyethylene oxide mono(meth)acrylate, polypropylene oxide mono(meth)acrylate, polyalkylene oxide mono(meth)acrylate and poly(ε-caprolactone) mono(meth)acrylates.

8. A process for producing media for recording visual holograms, comprising applying the polyurethane composition as claimed in claim 1 to a substrate or to a mold and curing the polyurethane composition and the substrate or mold.

9. A medium for recording visual holograms obtained by the process as claimed in claim 8.

10. An optical element or image comprising the medium as claimed in claim 9.

11. A process comprising the step of recording a hologram onto the medium as claimed in claim 9 in an exposure process to produce a hologram for optical applications in the entire visible and near UV ranges.

* * * * *